(12) United States Patent
Oh et al.

(10) Patent No.: US 10,566,343 B2
(45) Date of Patent: Feb. 18, 2020

(54) SEMICONDUCTOR MEMORY DEVICE INCLUDING 3-DIMENSIONAL STRUCTURE AND METHOD FOR MANUFACTURING THE SAME

(71) Applicant: SK hynix Inc., Gyeonggi-do (KR)

(72) Inventors: Sung-Lae Oh, Chungcheongbuk-do (KR); Jin-Ho Kim, Gyeonggi-do (KR); Chang-Man Son, Gyeonggi-do (KR); Go-Hyun Lee, Gyeonggi-do (KR); Young-Ock Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 70 days.

(21) Appl. No.: 15/803,035

(22) Filed: Nov. 3, 2017

(65) Prior Publication Data
US 2018/0053782 A1 Feb. 22, 2018

Related U.S. Application Data

(62) Division of application No. 15/260,011, filed on Sep. 8, 2016, now Pat. No. 9,837,433.

(30) Foreign Application Priority Data

May 4, 2016 (KR) .......................... 10-2016-0055420

(51) Int. Cl.
*H01L 27/11582* (2017.01)
*H01L 27/11573* (2017.01)
*H01L 27/06* (2006.01)
*H01L 27/11565* (2017.01)
*H01L 27/11575* (2017.01)
(Continued)

(52) U.S. Cl.
CPC ...... *H01L 27/11582* (2013.01); *H01L 23/528* (2013.01); *H01L 23/5226* (2013.01); *H01L 27/0688* (2013.01); *H01L 27/1157* (2013.01); *H01L 27/11565* (2013.01); *H01L 27/11573* (2013.01); *H01L 27/11575* (2013.01)

(58) Field of Classification Search
CPC ............. H01L 21/8221; H01L 27/0688; H01L 23/481; H01L 21/768
IPC ......................... H01L 21/8221,23/481, 27/0688
See application file for complete search history.

(56) References Cited

U.S. PATENT DOCUMENTS

| | | | | |
|---|---|---|---|---|
| 2015/0069616 A1* | 3/2015 | Oh | .......................... | H01L 23/48 257/773 |
| 2015/0303214 A1* | 10/2015 | Kim | .................. | H01L 27/11582 257/329 |
| 2015/0325588 A1* | 11/2015 | Lee | .................. | H01L 27/11573 257/329 |

FOREIGN PATENT DOCUMENTS

KR 10-2014-0052398 5/2014

* cited by examiner

*Primary Examiner* — Kenneth Parker
*Assistant Examiner* — Long H Le
(74) *Attorney, Agent, or Firm* — IP & T Group LLP

(57) ABSTRACT

A semiconductor memory device mc des a substrate defined with cell regions and a contact region between the cell regions; a dielectric structure formed over the contact region; a memory block having cell parts which are respectively formed over the cell regions, a coupling part which is formed over the contact region and couples the cell parts, and a through part which accommodates the dielectric structure; a peripheral circuit formed over the substrate under the memory block; bottom wiring lines disposed between the memory block and the peripheral circuit, and electrically coupled with the peripheral circuit; top wiring lines disposed over the memory block; and contact plugs passing through the dielectric structure and coupling the bottom wiring lines and the top wiring lines.

7 Claims, 20 Drawing Sheets

(51) Int. Cl.
*H01L 23/522* (2006.01)
*H01L 23/528* (2006.01)
*H01L 27/1157* (2017.01)

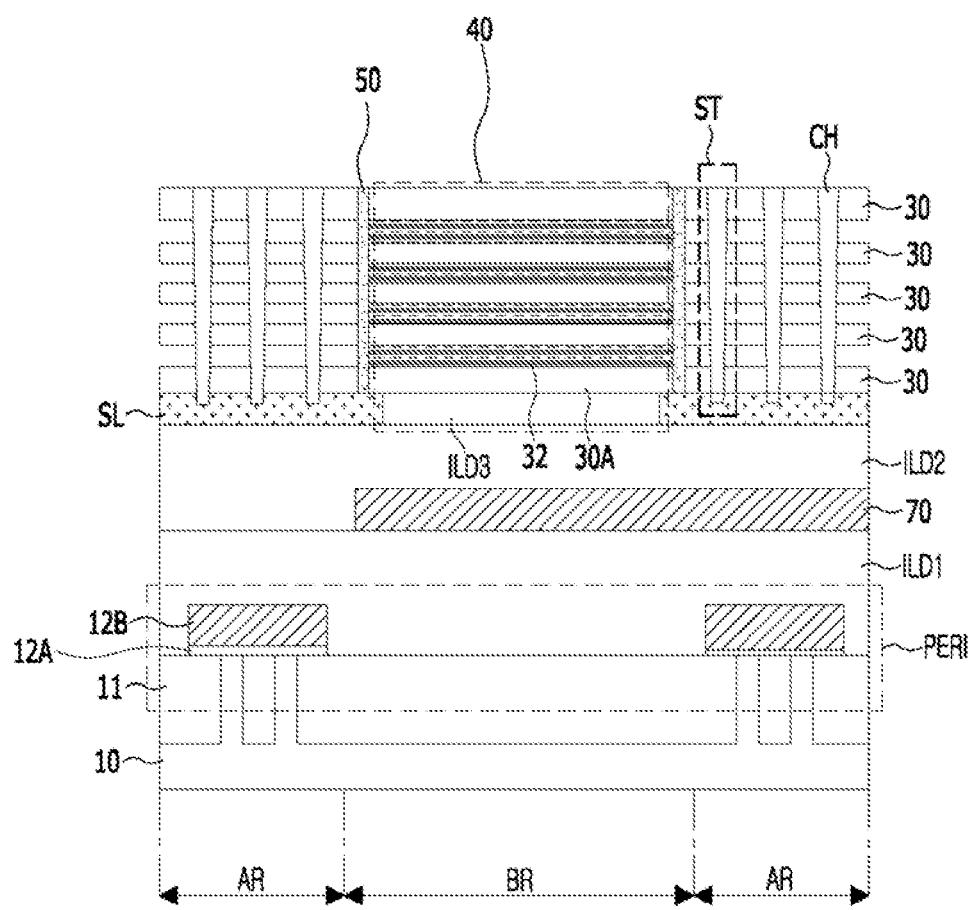

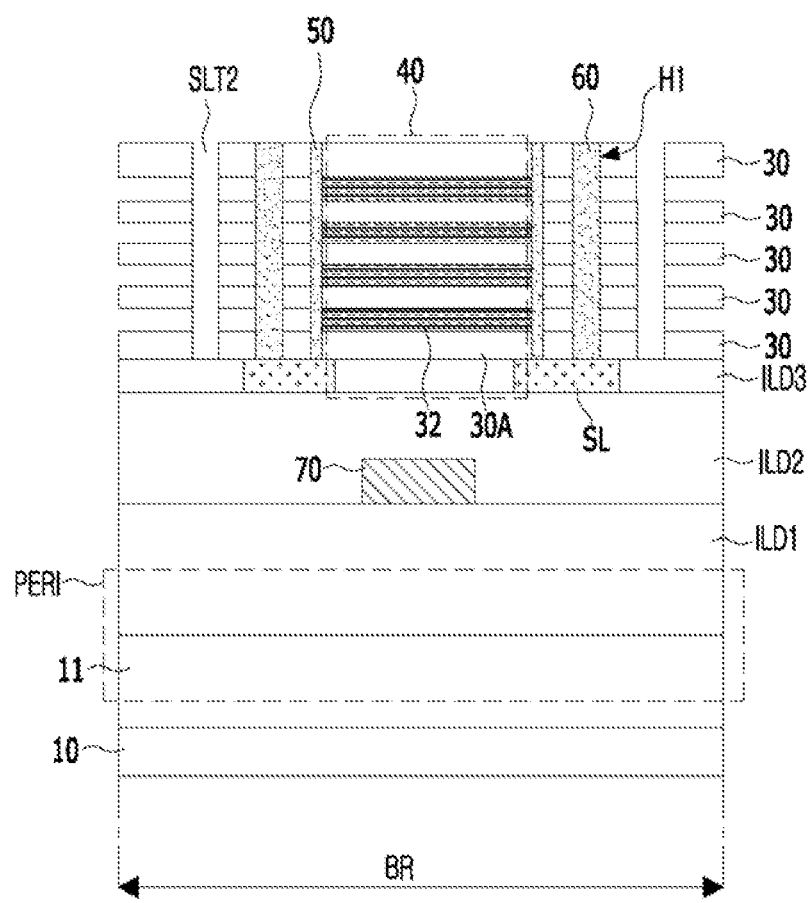

SEMICONDUCTOR MEMORY DEVICE INCLUDING 3-DIMENSIONAL STRUCTURE AND METHOD FOR MANUFACTURING THE SAME

CROSS-REFERENCE TO RELATED APPLICATION

This application is a division of U.S. patent application Ser. No. 15/260,011 filed on Sep. 8, 2016, which claims priority under 35 U.S.C. § 119 to Korean Patent Application No. 10-2016-0055420 filed in the Korean Intellectual Property Office on May 4, 2016. The disclosure of each of the foregoing applications is incorporated herein by reference in its entirety.

TECHNICAL FIELD

Various embodiments generally relate generally to a semiconductor memory device of a 3-dimensional structure and a method for manufacturing the same.

BACKGROUND

For achieving even higher integration, a semiconductor emery device of a 3-dimensional structure in which memory cells are ranged in a 3-dimensional structure has been recently suggested in the art. At the present time, a lot of research is directed to developing various improved technologies for further improving the characteristics and the degree of integration of such 3-dimensional semiconductor memory devices.

SUMMARY

The present invention is directed to an improved three dimensional structure and a method for manufacturing the same.

In an embodiment, a semiconductor memory device may include: a substrate comprising cell regions and a contact region between the cell regions; a dielectric structure formed over the contact region; a memory block having cell parts which are respectively formed over the cell regions, a coupling part which is formed over the contact region and couples the cell parts, and a through part which accommodates the dielectric structure; a peripheral circuit formed over the substrate under the memory block; bottom wiring lines disposed between the memory block and the peripheral circuit, the bottom wiring lines being electrically coupled with the peripheral circuit; top wiring lines disposed over the memory block; and contact plugs passing through the dielectric structure and coupling the bottom wiring lines and the top wiring lines.

In an embodiment, method for manufacturing semiconductor memory device may include: forming a peripheral circuit over a substrate which is defined with cell regions and a contact region between the cell regions; forming bottom wiring lines which are electrically coupled with the peripheral circuit, over the peripheral circuit; stacking alternately interlayer dielectric layers and sacrificial layers over the bottom wiring lines; forming a first slit for dividing the interlayer dielectric layers and the sacrificial layers of the contact region into a first portion and a second portion, wherein the first portion is continuous with the interlayer dielectric layers and the sacrificial layers of the cell region, and the second portion is isolated from the first portion and the interlayer dielectric layers and the sacrificial layers of the cell region by the first slit, thereby form a dielectric structure constructed with the second portion; forming a dielectric sidewall layer which fills the first slit; forming a second slit through the interlayer dielectric layers and the sacrificial layers; removing the sacrificial layers which are exposed by the second slit; forming a conductive material in spaces from which the sacrificial layers are removed, and thereby forming conductive lines; forming contact plugs which are electrically coupled with the bottom wiring lines, through the dielectric structure; and forming top wiring lines which are electrically coupled with the contact plugs.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
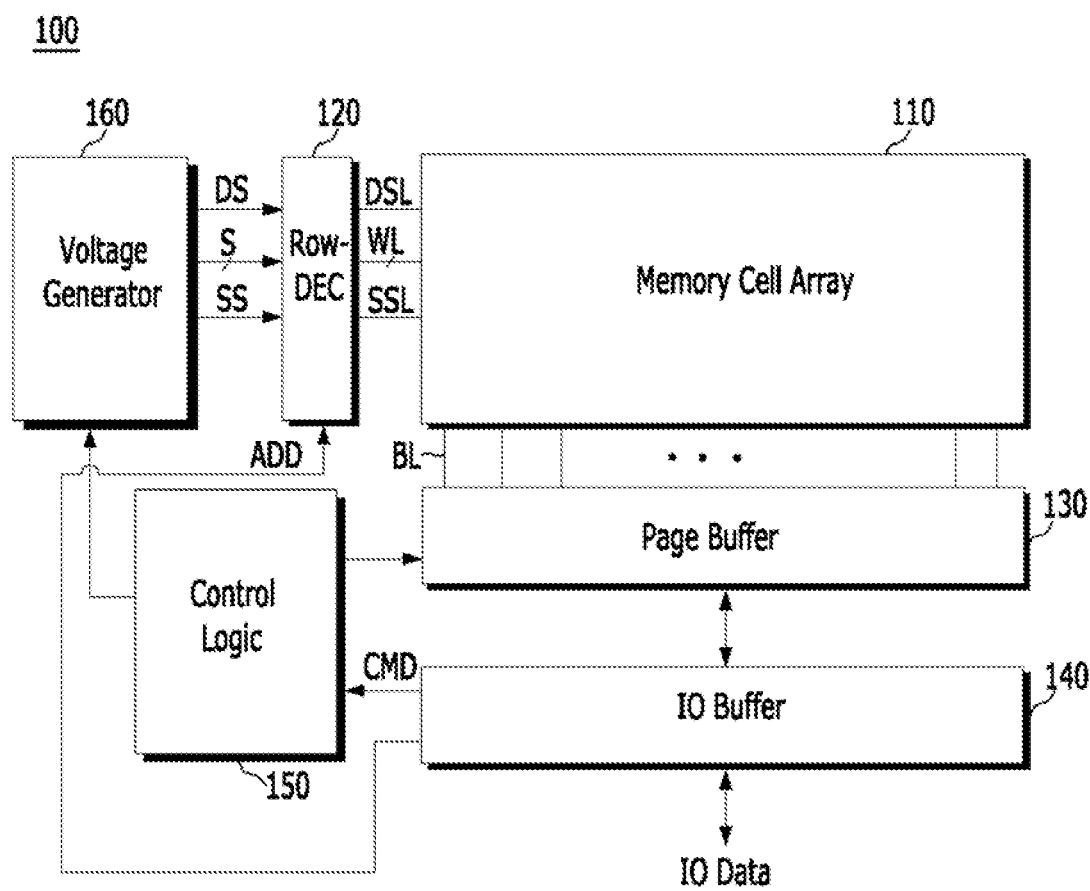
FIG. 1 is amplified block diagram illustrating a representation of an example of a semiconductor memory device in accordance with an embodiment of the present invention.
Figure 2:
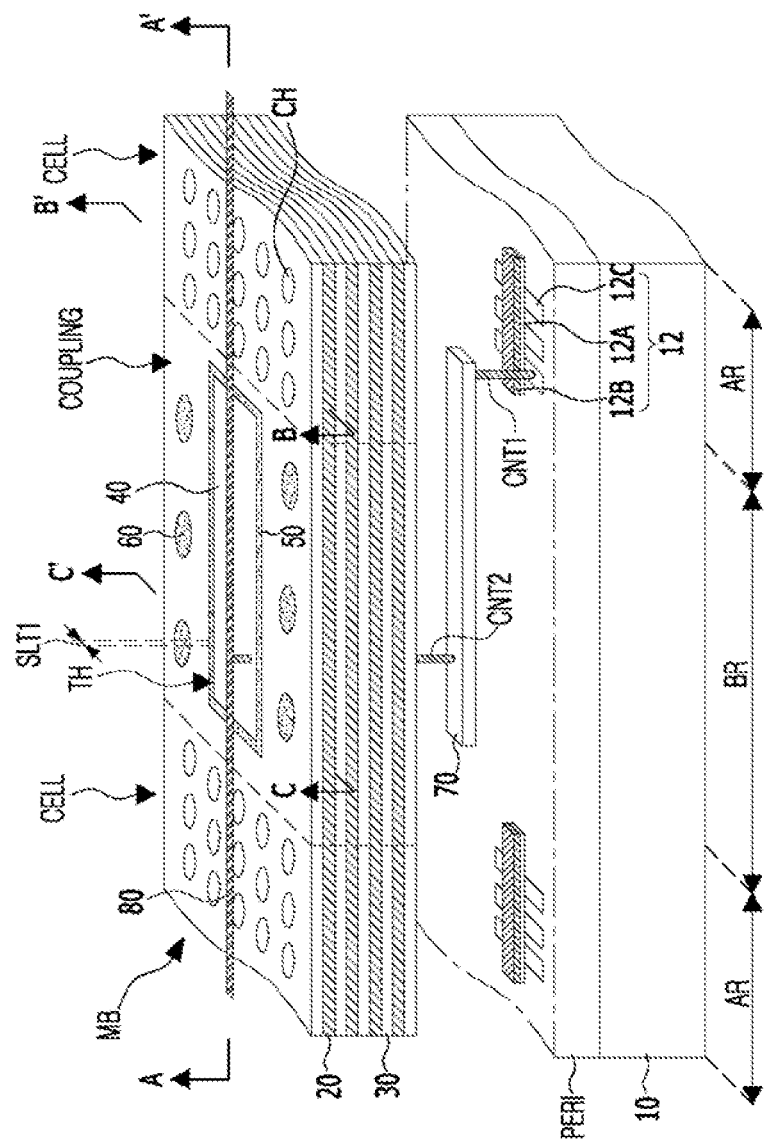
FIG. 2 is a perspective view illustrating a representation of an example of a semiconductor memory device in accordance with an embodiment of the present invention.
Figure 3:
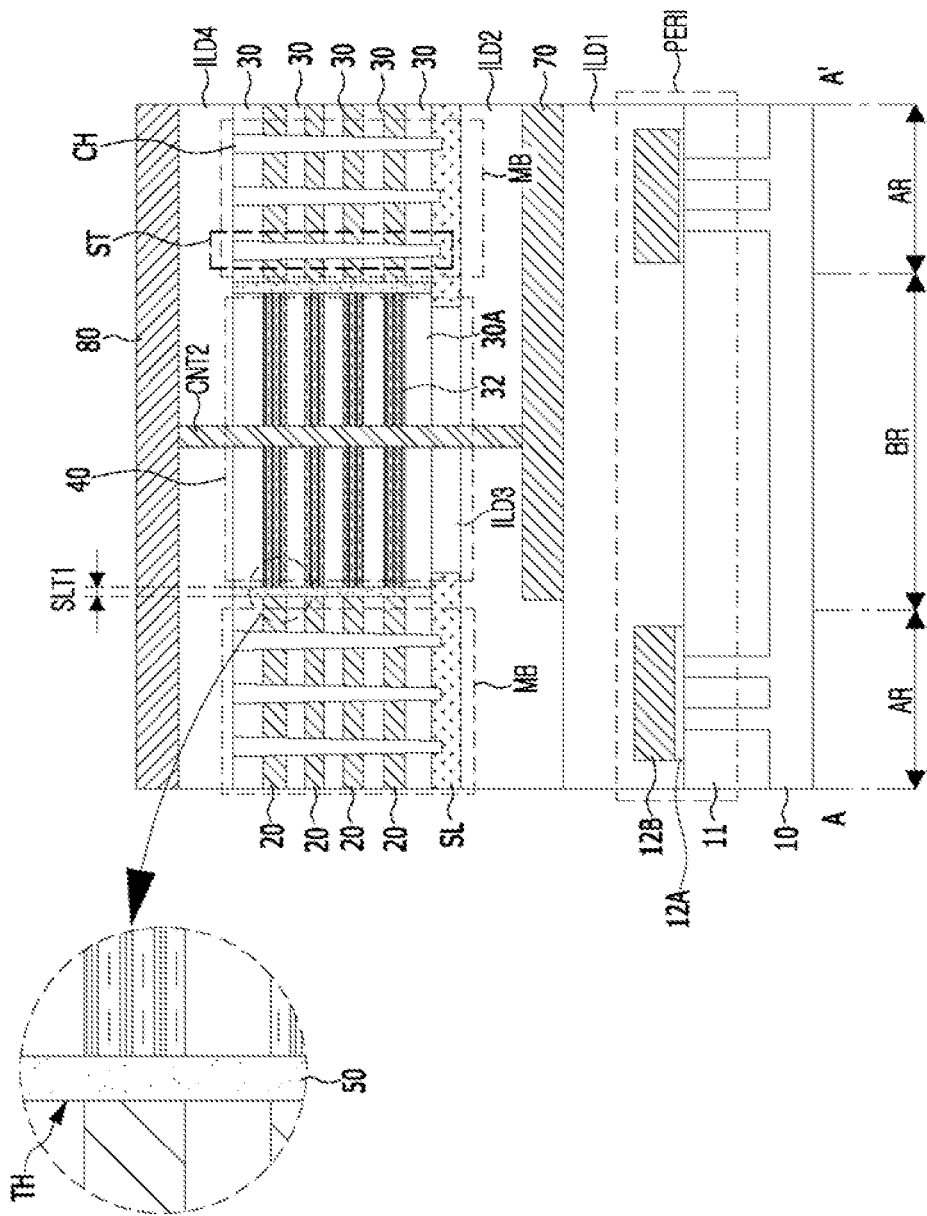
FIG. 3 is a cross-sectional view taken along the line A-A' of FIG. 2.
Figure 4:
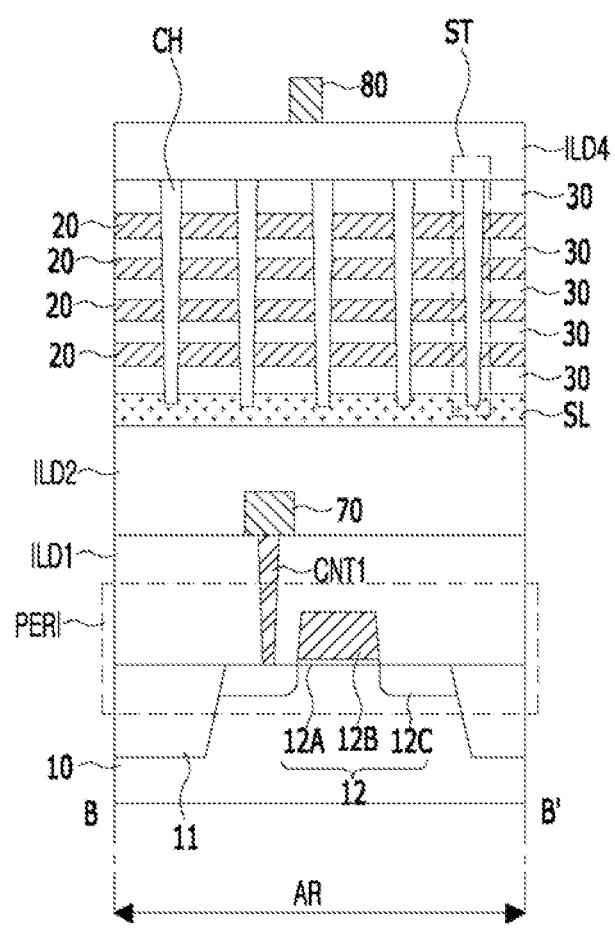
FIG. 4 is a cross-sectional view taken along the line B-B' of FIG. 2.
Figure 5:
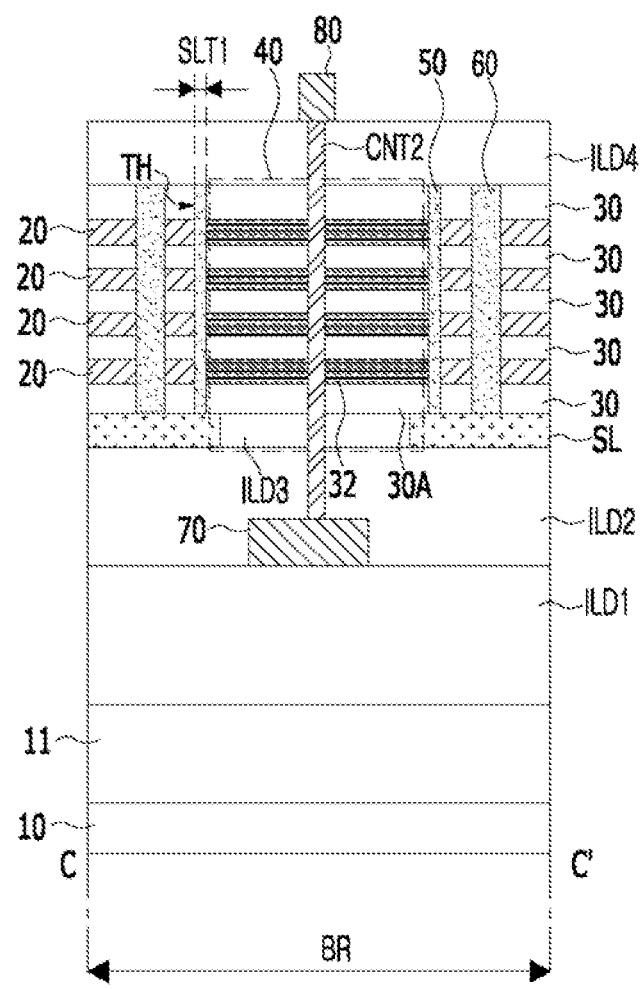
FIG. 5 is a cross-sectional view taken along the line C-C' of FIG. 2.

Hereinafter, a semiconductor memory device of a 3-dimensional structure and a method for manufacturing the same will be described below with reference to the accompanying drawings through various examples of embodiments. The present invention, however, may be embodied in various different forms, and should not be construed as being limited only to the illustrated embodiments. Rather, these embodiments are provided as examples so that this disclosure will be thorough and complete, and will fully convey the present invention to those skilled in the art to which this invention pertains.

It will be understood that, although the terms "first", "second", "third" and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes" and "including" when used in this specification specify the presence of the stated elements and do not preclude the presence or addition of one or more other elements. As used herein the term "and/or" includes any and al combination of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Referring now to FIG. 1, a semiconductor memory device 100 is provided, according to an embodiment of the present invention. The semiconductor memory device 100 may include a memory cell array 110 and a peripheral circuit which may include a row decoder 120, a page buffer 130, an input/output buffer 140, a control logic 150 and a voltage generator 160.

The memory cell array 110 may be coupled to the decoder 120 through word lines WL and select lines, i.e., drain select and source select lines DSL and SSL. The memory cell array 110 may be coupled to the page buffer 130 through bit lines BL.

The memory cell array 110 may include a plurality of memory blocks. Each of the plurality of memory blocks may correspond to an erase unit Each of the memory blocks may include a plurality of cell strings. Each cell string may be a unit of memory cells which are coupled in series. The memory cells included in each cell string may be selected by the same select transistor.

The row decoder 120 may select any one among the memory blocks of the memory cell array 110 in response to an address ADD received from the input/output buffer 140. The row decoder 120 may select any one among the word lines WL of a selected memory block. The row decoder 120 may transfer driving signals DS, S, SS received from the voltage generator 160, to the word lines WL or the select lines DSL and SSL of the selected memory block. The driving signals DS, S, SS may include word line voltages S and select signals DS SS. The word line voltages S of a high voltage may be provided to the word lines WL, of the selected memory block. To transfer a high voltage, the row decoder 120 may include pass transistors which are constructed by high voltage transistors.

The page buffer 130 may operate as a write driver or a sense amplifier according to an operation mode. In a program operation, the page buffer 130 operates as a write driver and may transfer a voltage corresponding to data to be programmed, to a bit line BL of the memory cell array 110. In a read operation, the page buffer 130 operates as a sense amplifier and may sense data stored in a selected memory cell, through a bit line BL, and transfer the sensed data to the input/output buffer 140. In an erase operation, the page buffer 130 may float bit lines BL of the memory cell array 110.

In a program operation, the input/output buffer 140 may transfer write data inputted from an external device, to the page buffer 130. In the read operation, the input/output buffer 140 may output data provided from the page buffer 130, to the exterior. The input/output buffer 140 may transfer the address ADD or a command CMD inputted from the external device, to the row decoder 120 or the control logic 150.

The control logic 150 may control the page buffer 130 and the voltage generator 160 to access selected memory cells, in response to the command CMD transferred from the input/output buffer 140.

The voltage generator 160 may generate the word line voltages S to be supplied to the respective word lines WL and voltages to be supplied to a bulk in which memory cells are formed, for example, a well region, according to control of the control logic 150. The word line voltages 5 to be supplied to the respective word lines WL include a program voltage (Vpgm), a pass voltage (Vpass), and selected and unselected read voltages (Vrd and Vread). The voltage generator 160 may generate the select signals DS and SS which are provided to the select lines DSL and SSL in read operation and program operations. The select signal DS control signal for selecting a cell string, and the select signal SS is a ground select signal.

Referring to FIGS. 2 to 5, a semiconductor memory device in accordance with an embodiment may include cell regions AR and a contact region BR which is disposed between the cell regions AR.

A memory cell array may be disposed on the cell regions AR and the contact region BR of a substrate 10. The memory cell array may include a memory block MB. The memory block MB may extend in a direction that extends across the cell regions AR and the contact region BR. Although only one memory block MB is illustrated in FIGS. 2 to 5, it is to be understood that a plurality of memory blocks MB are formed on the substrate 10.

The memory block MB may include cell parts CELL which are respectively formed on the cell regions AR of the substrate 10, a coupling part COUPLING which is formed on the contact region BR and couples the cell parts CELL, and a through part TH which accommodates a dielectric structure 40.

The cell parts CELL and the coupling part COUPLING may include a plurality of conductive line layers 20 (also referred to as conductive lines) and a plurality of interlayer dielectric layers 30 which are stacked alternately in a direction substantially perpendicular to the plane of the substrate. At least one lowermost layer and at least one uppermost layer among the conductive lines 20 may be used as the select lines of select transistors. Conductive lines between the select lines may be used a word lines for the memory cells.

Figure 6:
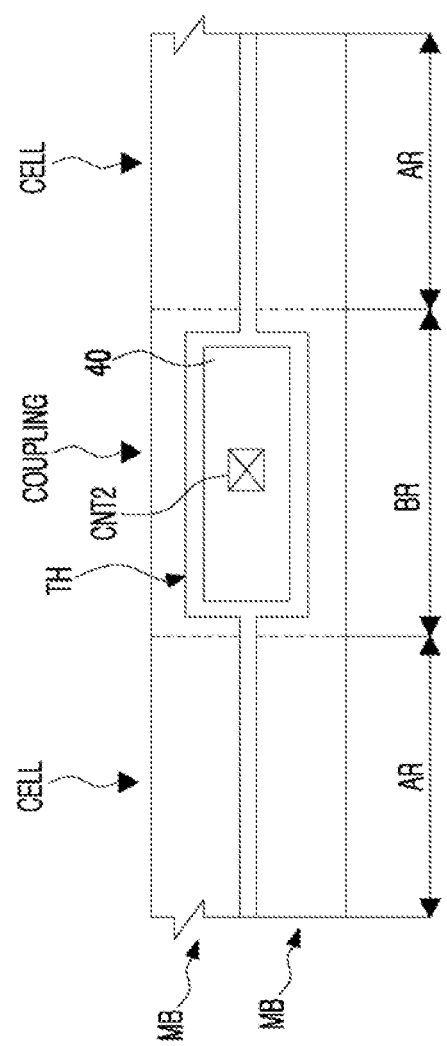
FIG. 6 is a top view illustrating a representation of an example of a main part of a semiconductor memory device in accordance with an embodiment of the present invention.

The through part TH provides a space for forming the dielectric structure 40. The through part TH may be surrounded by the coupling part COUPLING. Hence, the dielectric structure 40 may be surrounded by the coupling part COUPLING. Meanwhile, referring to FIG. 6, the through part TH may be disposed on one side of the coupling part COUPLING, and the dielectric structure 40 may be disposed on one side of the coupling part COUPLING.

Referring again to FIGS. 2 to 5, the dielectric structure 40 may include first and second material layers 30A and 32 which are stacked alternately. The first material layers 30A may be disposed at the same level (vertical distance f the substrate 10) as the interlayer dielectric layers 30 of the memory block MB, and the second material layers 32 may be disposed at the same level as the conductive lines 20 of the memory block MB. The first material layers 30A may be formed of the same dielectric material as the interlayer dielectric layers 30 of the memory block MB and the second material layers 32 may be formed of a dielectric material which has an etching selectivity different from the interlayer dielectric layers 30. For example, the first material layers 30A and the interlayer dielectric layers 30 may be formed of an oxide-based material, and the second material layers 32 may be formed of a nitride-based material. The dielectric structure 40 may have a line shape that extends in the lengthwise direction of the memory block MB.

A first slit SLT1 may be formed between, the dielectric structure 40 and the memory block MB. The first slit SLT1 may be filled with a dielectric sidewall layer 50. The dielectric sidewall layer 50 may be formed of the same material as the interlayer dielectric layers 30 and the first material layers 30A, for example, an oxide-based material.

In each cell region AR, channel layers CH may be formed to pass through the conductive lines 20 and the interlayer dielectric layers 30. The respective channel layers CH may be formed in a buried type such that the channel layers CH fully fill through holes passing through the conductive lines 20 and the interlayer dielectric layers 30. The respective channel layers CH may be formed in a tube type such that the channel layers CH fill through holes passing through the conductive lines 20 and the interlayer dielectric layers 30 in such a way as to surround dielectric layers which are formed at the centers of the through holes. The respective channel layers CH may be formed into a structure including the buried type and the tube type.

One end of each channel layer CH may be coupled with a bit line (not shown) which is formed on the memory block MB, and the other end of each channel layer CH may be coupled with a source line SL which is formed under the memory block MB. While not shown, it may be envisaged that a pair of channel layers CH are coupled into a U shape through a pipeline channel and both a bit line and a source line are formed on the me block MB.

Select transistors may be formed at crossing points of the select lines and the channel layers CH, and memory cells may be formed at crossing points of the word lines and the channel layers CH. By such a structure, cell strings ST may be formed as a plurality of memory cells stacked between the select transistors are coupled in series by the channel layers CH. While not shown, between the channel layers CH and the conductive lines 20 for the word lines, there may be additionally formed multiple layers including a tunnel dielectric layer, a charge trap layer and a charge blocking layer. Between the channel layers CH and the conductive lines 20 for the select lines, there may be additionally formed gate dielectric layers.

In the coupling, part COUPLING, there may be formed supports 60 which pass through the conductive lines 20 and the interlayer dielectric layers 30. The supports 60 may be formed using the same material as the interlayer dielectric layers 30 for example, an oxide-biased material.

A peripheral circuit PERI may be formed on the substrate 10 under the memory block MB. The peripheral circuit PERI may include a row decoder, a page buffer, an input/output buffer, a control logic, a voltage generator, and so forth.

The peripheral circuit PERI may include transistors 12. The transistors 12 may include, for example, pass transistors which are included in the row decoder. The pass transistors may be electrically coupled with the conductive lines 20, in detail, the select lines and the word lines, and provide operating voltages to the select lines and the word lines in response to a block select signal.

Each of the transistors 12 may include a gate dielectric layer 12A which is formed on the active region defined by an isolation layer 11 formed in the substrate 10, a gate electrode 12B which is formed on the gate dielectric layer 12A, and impurity regions 12C which are formed in the active region on both sides of the gate electrode 12B. The impurity regions 12C may be used as the source and drain of each transistor 12. In the present embodiment, since the peripheral circuit PERI is disposed to overlap with the memory block MB, the area of the substrate 10 may be utilized to the maximum, whereby the size of the semiconductor memory device may be reduced.

Bottom wiring lines 70 may be formed between the memory block MB and the peripheral circuit PERI. At least one dielectric layer ILD1 which covers the peripheral circuit PERI may be formed over the substrate 10. The bottom wiring lines 70 may be disposed on the dielectric layer ILD1, and be electrically coupled with the peripheral circuit PERI through contact plugs CNT1 which pass through the dielectric layer ILD1. While only one bottom wiring line 70 and only one contact plug CNT1 are illustrated in FIGS. 2 to 5 for the sake of simplification in illustration, it is to be understood that a plurality of bottom wiring lines 70 and a plurality of contact plugs CNT1 are provided. One or more dielectric layers ILD2 and ILD3 which cover the bottom wiring lines 70 may be formed on the dielectric layer ILD1, and the memory block MB and the dielectric structure 40 may be disposed planarly on the dielectric layer ILD3.

Since the transistors which are included in the peripheral circuit PERI may be high voltage transistors for transferring high voltages, a large amount of heat may be generated in the transistors of the peripheral circuit PERI while the semiconductor memory device operates. Because the bottom wiring lines 70 are disposed near the peripheral circuit PERI, the bottom wiring lines 70 may be formed using tungsten as a material having an excellent thermal characteristic, to endure the heat generated in the peripheral circuit PERI while the semiconductor memory device operates. As a semiconductor memory device is highly integrated, the number of signals to be transferred through the peripheral circuit PERI increases, and in correspondence to this, it is necessary to increase the number of the bottom wiring lines 70. To form an increased number of bottom wiring lines 70 within a limited space, the bottom wiring lines 70 should be formed with a fine pitch. In this regard, since tungsten forming the bottom wiring lines 70 has a high resistance value, the resistance of the bottom wiring lines 70 may be excessively increased and thus it is difficult to secure signal integrity, in the case where the bottom wiring lines 70 are formed with a fine pitch or a long length.

To eliminating the needs to form bottom wiring lines having a fine pitch or a long length top wiring lines 80 may be formed on the memory block MB. While only one top wiring line 80 is illustrated FIGS. 2 to 5 for the sake of simplification in illustration, it is to be understood that a plurality of top wiring lines 80 are formed on the memory block MB.

At least one dielectric layer ILD4 which covers the memory block MB and the dielectric structure 40 may be formed on the memory block MB and the dielectric structure 40 and the top wiring lines 80 may be disposed on the dielectric layer ILD4.

Because the top wiring lines 80 which are formed on the memory block MB are more distant from the peripheral circuit PERI than the bottom wiring lines 70, the top wiring lines 80 are not required to form a material having a excellent thermal characteristic, unlike the bottom wiring lines 70. The top wiring lines 80 may be formed using a conductive material which has lower resistance than the bottom wiring lines 70. For example, the top wiring lines 80 may be formed of copper whereas the bottom wiring lines 70 may be formed of tungsten For electrically coupling the top wiring, lines 80 and the bottom wiring lines 70, contact plugs CNT2 which pass through the dielectric structure 40 may be formed. The contact plugs CNT2 may pass through the dielectric structure 40 and electrically couple the top wiring lines 80 which are disposed over the memory block MB and the bottom wiring lines 70 which are disposed under the memory block MB.

According to the present embodiment, since the contact plugs CNT2, which electrically couple the top wiring lines 80 and the bottom wiring lines 70, pass through the dielectric structure 40 which is formed in the through part TH of the memory block MB, it is not necessary to cut the memory block MB, and in particular, it is not necessary to cut the conductive lines 20 of the memory block MB, to secure spaces for forming the contact plugs CNT2. If it weren't for the dielectric structure 40 which is formed in the through part TH of the memory block MB, it would have been necessary to form coupling wiring lines to couple cut conductive lines which would have to be cut for securing spaces for forming the contact plugs CNT2. By employing the dielectric structure 40 formed in the through part TH of the memory block MB no coupling wiring lines are needed. As a consequence, occurrence of a failure due to poor coupling between the coupling wiring lines and the conductive lines is prevented, and a semiconductor memory device having improved electrical characteristics and reliability is provided. Moreover, it is not necessary to pattern the conductive lines 20 of the contact region BR in a step-like shape to be coupled with the coupling wiring lines, hence, an increase in area due to patterning of the conductive lines 20 of the contact region BR in a step-like shape may be prevented, whereby an improvement in the degree of integration of the semiconductor memory device may be achieved.

In an embodiment, the coupling part COUPLING may be in continuity with the cell parts CELL. A first portion of each of the conductive lines 20 in the coupling part COUPLING may be in continuity with a second portion of each of the conductive lines 20 in the cell parts CELL.

Figure 7:
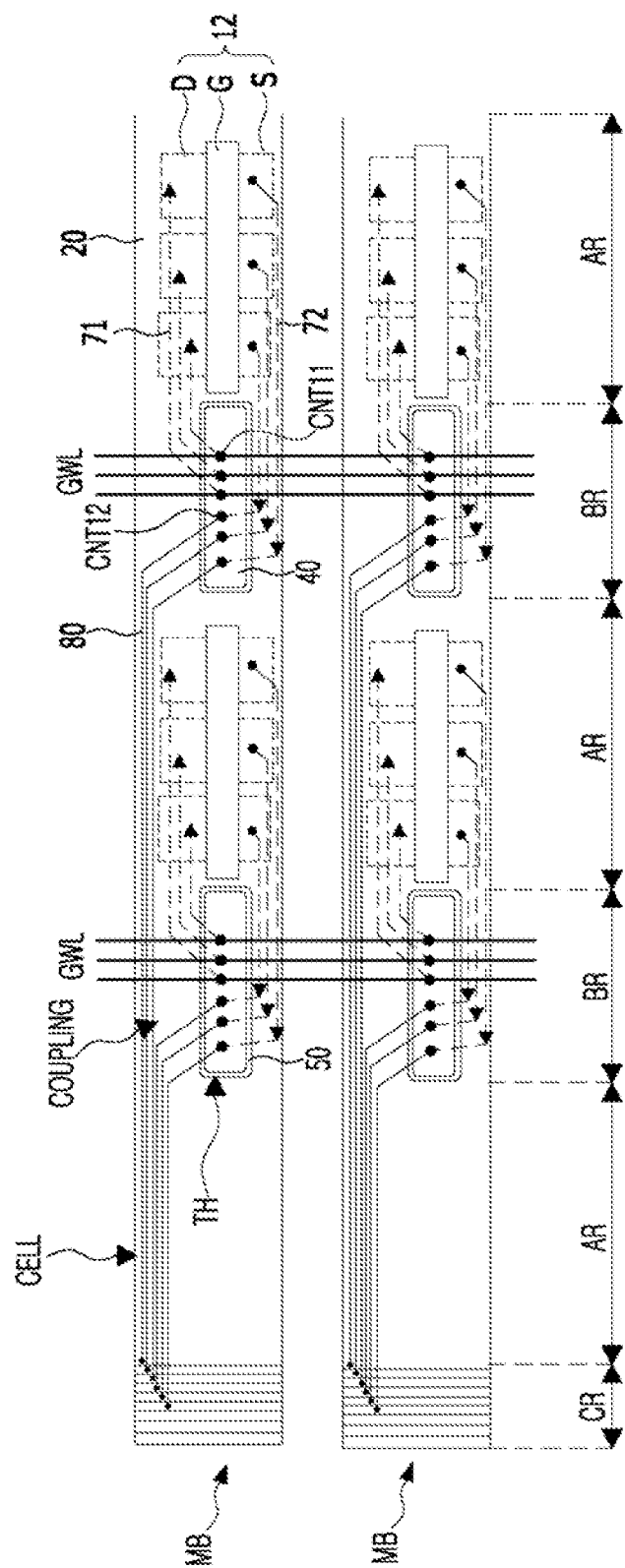
FIG. 7 is a top view schematically illustrating a representation of an example of a semiconductor memory device in accordance with an embodiment of the present invention.

FIG. 7 is a view illustrating a layout structure of bottom wiring lines and top wiring lines in the case where a peripheral circuit includes the pass transistors of a row decoder.

Referring to FIG. 7, a semiconductor memory device may include cell regions AR, contact regions BR which are disposed between the cell regions AR, and a slimming region CR.

A plurality of memory blocks MB may be disposed on the cell regions AR, the contact regions BR and the slimming region CR to extend across the cell regions AR, the contact regions BR and the summing region CR.

The memory block MB may include cell parts CELL which are respectively formed on the cell regions AR of the substrate 10, a coupling part COUPLING which is formed on the contact region BR and couples the cell parts CELL, and a through part TH which accommodates a dielectric structure 40.

The cell parts CELL and the coupling part COUPLING may include a plurality of conductive line layers 20 (also referred to as conductive lines) and a plurality of interlayer dielectric layers 30 which are stacked alternately in a direction substantially perpendicular to the plane of the substrate.

In order to be coupled with contact plugs (not shown) which transfer operating voltages, the conductive lines 20 are formed in such a way as to gradually project toward the slimming region CR in a downward direction to form a step-like shape pattern in the slimming region CR.

Pass transistors 12 may be formed, as a peripheral circuit, under the memory blocks MB. Each of the pass transistors 12 may include a gate dielectric layer (not shown) which is formed on the active region defined by the isolation layer formed in a substrate, a gate electrode G which is formed on the gate dielectric layer, and impurity regions S and D which are formed in the active region on both sides of the gate electrode G. The impurity regions S and D may be used as a source S and a drain D of each pass transistor 12.

The pass transistors 12 may be driven in response to a block select signal applied to the gate electrodes G thereof. The drains of the pass transistors 12 may be electrically coupled to global word lines GWL through bottom wiring lines 71 and contact plugs CNT11, and the sources S of the pass transistors 12 may be electrically coupled to the conductive lines 20 of the slimming region CR through bottom wiring lines 72, contact plugs CNT12 and top wiring lines 80.

In the case where a memory block MB is selected, the block select signal is enabled by the block decoder (not shown) of the row decoder. The pass transistors 12 may be turned on in response to the block select signal which is enabled, and may transfer the operating voltages inputted through the bottom wiring lines 71 and the contact plugs CNT11 from the global word lines GWL, to the conductive lines 20 through the bottom wiring lines 72, the contact plugs CNT12 and the top wiring lines 80.

The conductive lines 20 are electrically coupled with the top wiring lines 80 through contact plugs (not shown) in the slimming region CR. Since the cell regions AR are arranged in the lengthwise direction of the memory blocks MB, to couple the pass transistors 12 formed in a cell region AR distant from the slimming region CR, with the conductive lines 20, routing wiring lines of a long length which extend in the lengthwise direction of the memory blocks MB are needed.

In the present embodiment, the bottom wiring lines 72 which made relatively high, resistance conductive material are formed to a short length to couple the cell region AR and the contact region BR neighboring each other, and the top wiring lines 80 which made relatively low resistance conductive material are formed to a long length to be coupled to the slimming region CR by extending across the cell regions AR and the contact regions BR. Therefore, because the resistance of the routing wiring lines which couple the pass transistors 12 and the conductive lines 20 may be reduced, the integrity of signals to be transferred to the conductive lines 20 through the routing wiring lines may be improved.

Hereafter, a method for manufacturing a semiconductor memory device, in accordance with an embodiment of the present invention will be described.

Figure 8A:
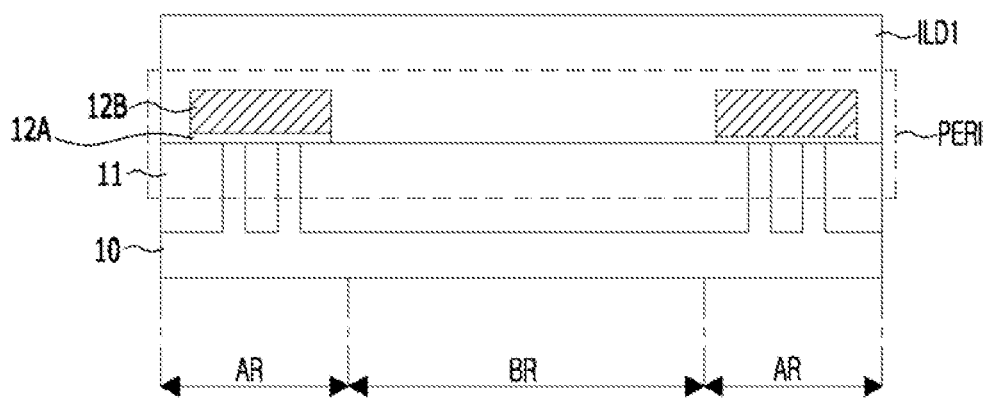
FIGS. 8A to 12B are representations of examples of cross-sectional views to assist in the explanation of a method for manufacturing a semiconductor memory device in accordance with an embodiment of the present invention.
Figure 8B:
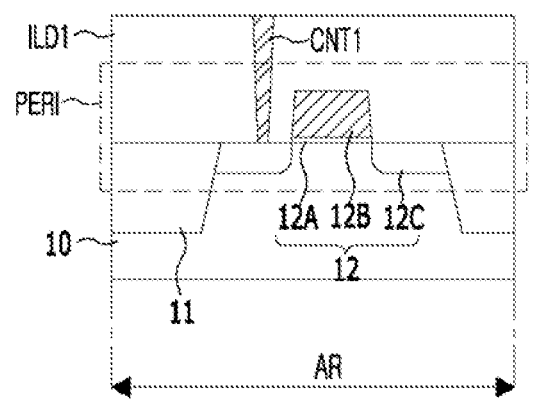

Referring to FIGS. 8A and 8B, a peripheral circuit PERI is formed on cell regions AR and a contact region BR of a substrate 10. An isolation layer 11 which defines an active region is formed on the substrate 10, a gate electrode 12B is formed on the substrate 10 which is formed with the isolation layer 11, with a gate dielectric layer 12A interposed therebetween Impurity regions 12C are formed by implanting an n type or p type impurity in the active region on both sides of the gate electrode 12B. The impurity regions 12C may be used as the source and drain of each transistor 12. The peripheral circuit PERI including transistors 12 is formed.

A dielectric layer ILD1 which covers the transistors 12 is formed, and contact plugs CNT1 which pass through the dielectric layer ILD1 and are electrically coupled with the peripheral circuit PERI are formed.

Figure 9A:
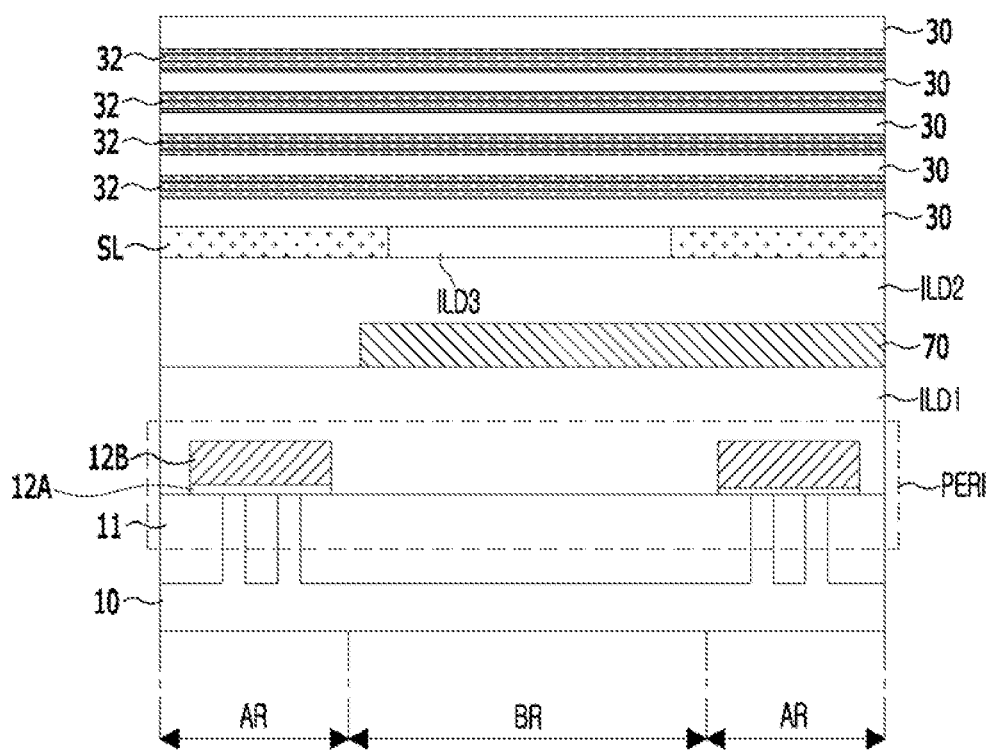
Figure 9B:
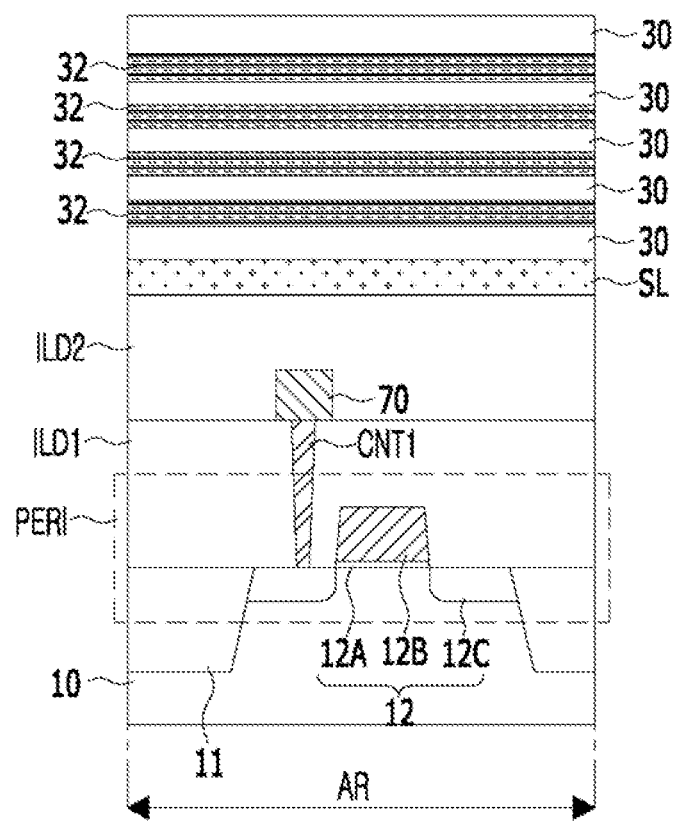

Referring to FIGS. 9A and 9B, bottom wiring lines 70 which are electrically coupled with the contact plugs CNT1 are formed on the dielectric layer ILD1. The bottom wiring lines 70 may be formed using tungsten as a material having an excellent thermal characteristic, to endure the heat generated in the peripheral circuit PERI.

A dielectric layer ILD2 which covers the bottom wiring lines 70 is formed. Then, source lines SL disposed at the same level are formed on the dielectric layer ILD2, and a dielectric ayes ILD3 formed between the source lines SL. Hence the source lines SL and the dielectric layer ILD3 are substantially coplanar.

Interlayer dielectric layers 30 and sacrificial layers 32 are alternately stacked on the source lines SL and the dielectric layer ILD3. The numbers of the interlayer dielectric layers 30 and the sacrificial layers 32 may be changed depending upon the number of memory cells to be stacked. The sacrificial layers 32 are formed where conductive lines to serve as word lines and select lines are to be formed. The sacrificial layers 32 may be formed of a material which has an etching selectivity different from the interlayer dielectric layers 30. For example, the interlayer dielectric layers 30 may be formed of an oxide-based material, and the sacrificial layers 32 may be formed of a nitride-based material.

Figure 10A:
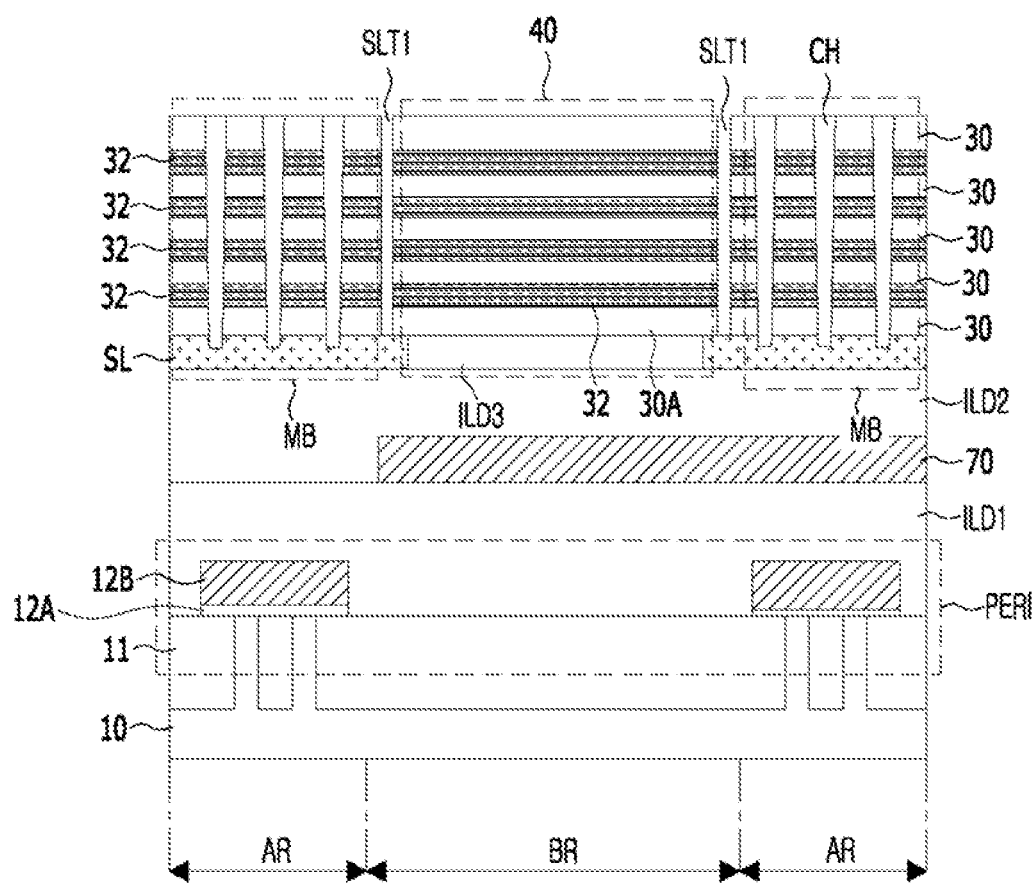
Figure 10B:
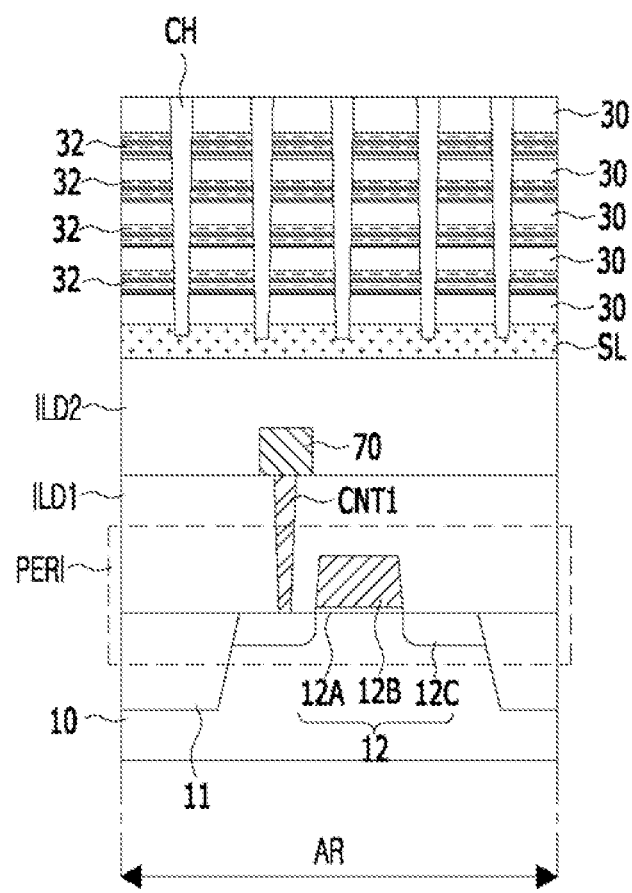
Figure 10C:
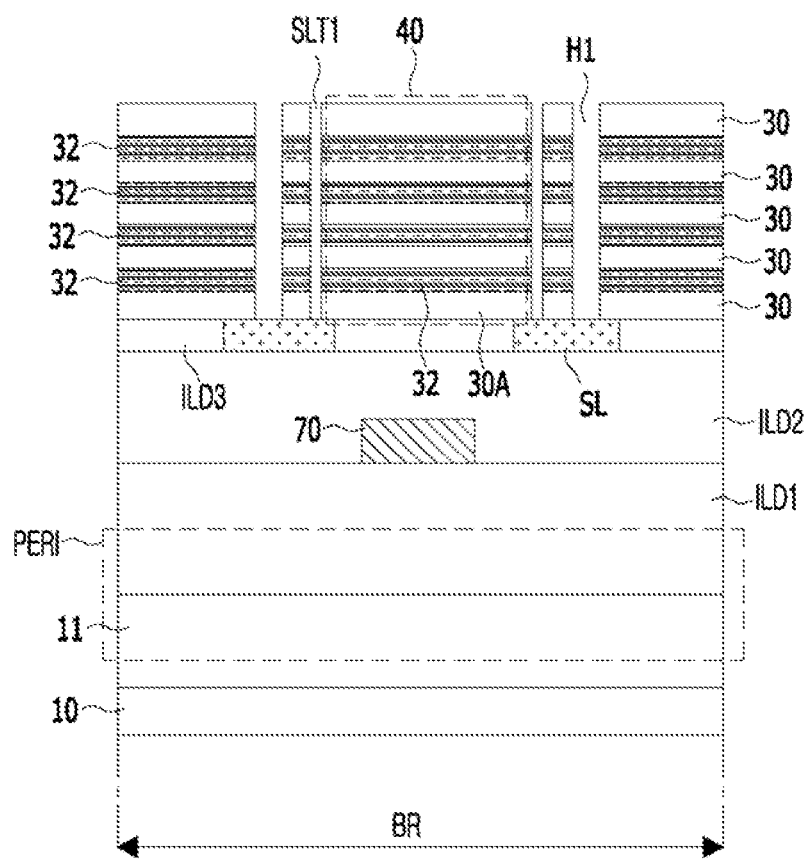

Referring to FIGS. 10A to 10C, channel layers CH which pass through the interlayer dielectric layers 30 and the sacrificial layers 32 of the cell regions AR and are coupled to the source lines SL are formed. After forming through holes which pass through the interlayer dielectric layers 30 and the sacrificial layers 32, the channel layers CH are formed in the through holes. The respective channel layers CH may be formed in a tube type on the sidewalls of the through holes in such a way as to open the center portions of the through holes, or may be formed in a buried type in such a way as to fully fill the through holes. In the case where the channel layers CH are formed in a tube type the open center portions of the respective channel layers CH may be filled with a dielectric material. The channel layers CH may be formed as semiconductor layers.

Before forming the channel layers CH, a multi-layered dielectric layer including at least any one of a tunnel dielectric layer, a data storage layer and a blocking dielectric layer may be formed on the sidewalls of the through holes. The tunnel dielectric layer may be formed as a silicon oxide layer, the data storage layer may be formed as a nitride layer capable of trapping charges, and the blocking dielectric layer may be formed as a silicon oxide layer capable of blocking charges or a high-k layer having a dielectric constant higher than a silicon oxide layer.

Next, through an etching process, a first slit SLT1 which passes through the interlayer dielectric layers 30 and the sacrificial layers 32 is formed in the contact region BR. The interlayer dielectric layers 30 and the sacrificial layers 32 of the contact region BR are divided into a first portion and the second portion by the first slit SLT1. The first portion is continuous with the interlayer dielectric layers and the sacrificial layers of the cell region, and the second portion is isolated from the first portion and the interlayer dielectric layers and the sacrificial layers of the cell region by the first slit SLT1. The second portion will be referred to as a dielectric structure 40.

Through holes H1 may be additionally formed through the first portion of the interlayer dielectric layers 30 and the sacrificial layers of the contact region BR by an etching process. The etching process for forming the through holes H1 may be performed simultaneously with the etching process for forming the first slit SLT1. Alternatively, the etching process for forming the through holes H1 may be performed before or after the etching process for forming the first slit SLT1.

Figure 11B:
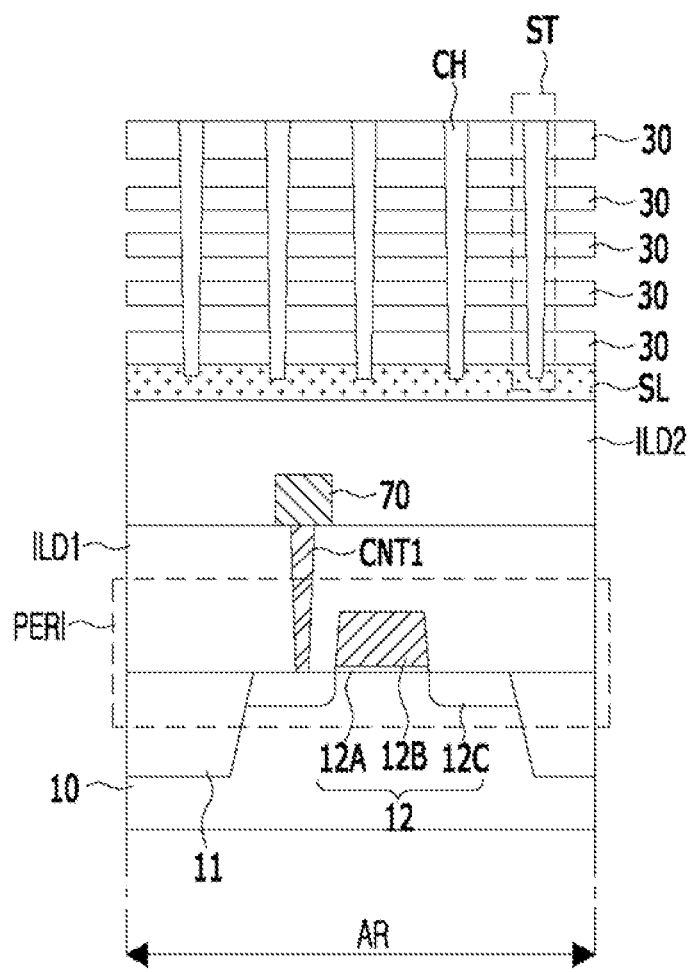

Referring to FIGS. 11A to 11C, a dielectric layer is formed to fill the first slit SLT1 and the through holes H1 and, by removing the dielectric layer which is formed outside the first slit SLT1 and the through holes H1, a dielectric sidewall layer 50 which fills the first slit SLT1 and supports 60 which fill the through holes H1 are formed. The dielectric sidewall layer 50 and the supports 60 may be formed of a material which has an etching selectivity different from the sacrificial layers 32, for example, an oxide-based material.

Then, by etching the interlayer dielectric layers 30 and the sacrificial layers 32, second slits SLT2 which pass through the interlayer dielectric layers 30 and the sacrificial layers 32 are formed. The interlayer dielectric layers 30 and the sacrificial layers 32 may be divided into memory block units by the second slits SLT2.

By removing the sacrificial layers 32 which are exposed by the second slits SLT2, open parts are formed. At this time, the sacrificial layers 32 of the dielectric structure 40 are not removed by being protected by the dielectric sidewall layer 50.

Figure 12A:
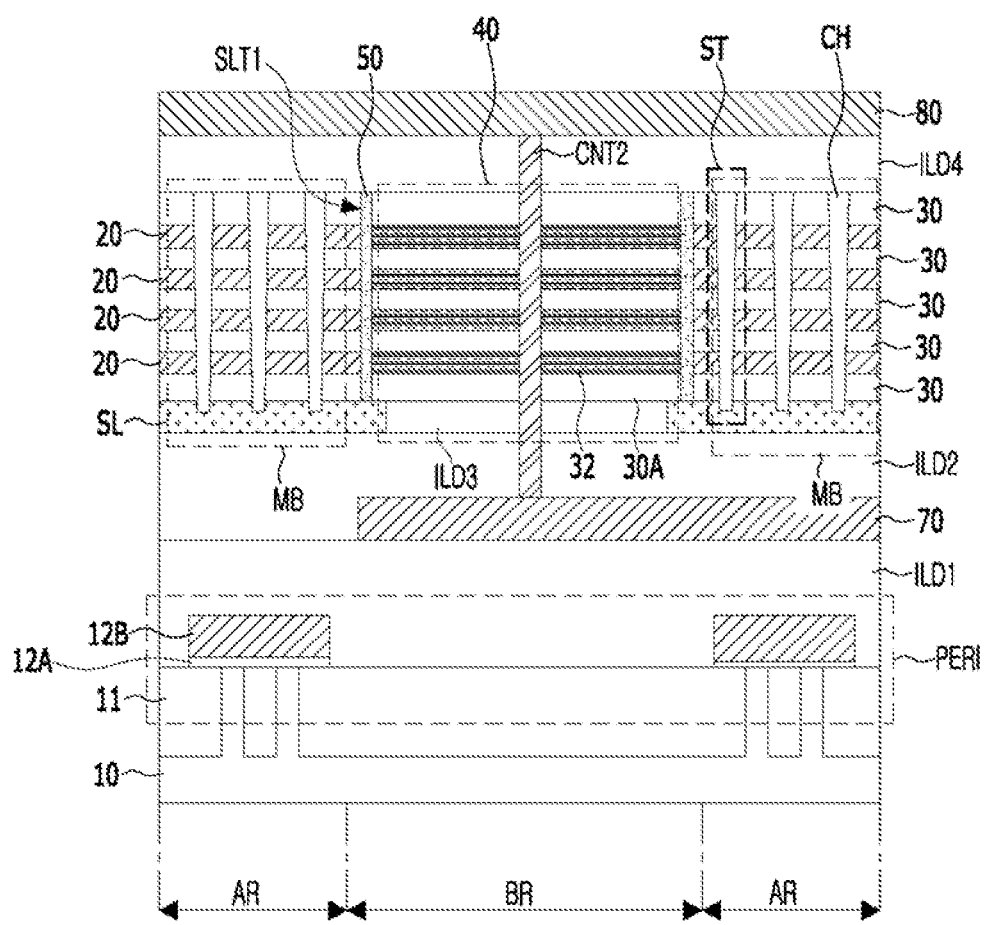
Figure 12B:
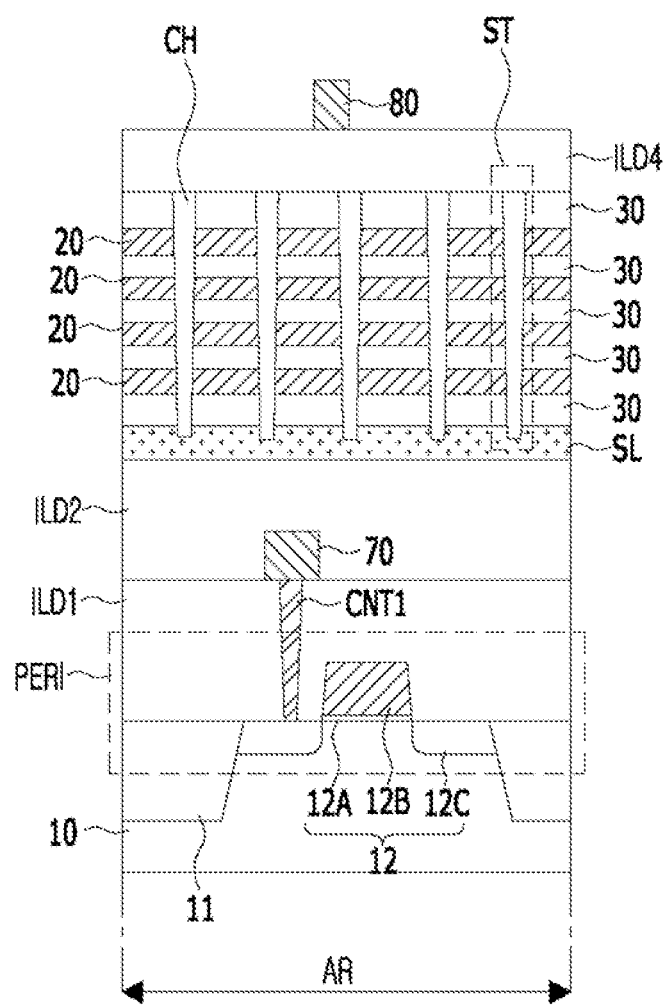

Referring to FIGS. 12A and 12B, by filling conductive material in the open parts which are formed due to the removal of the sacrificial layers 32, conductive lines 20 are formed.

By forming, through the above-described processes, the interlayer dielectric layers 30 and the conductive lines 20 through which the channel layers CH pass, cell strings ST which include memory cells stacked 3-dimensionally along the channel layers CH may be formed. Among the conductive lines 20, at least the lowermost layer adjacent to the source lines SL may be used as a first select line, and at least the uppermost layer may be used as a second select line, and the remaining layers may be used as word lines. Each cell string ST is constructed by at least one first select transistor, memory cells and at least one second select transistor which are coupled in series. As a consequence, a plurality of memory blocks MB which are separated by the second slits SLT2 are formed.

The dielectric structure 40 is to provide spaces for forming contact plugs CNT2 which electrically couple the bottom wiring lines 70 with top wiring lines 80 to be formed subsequently, and is isolated from the memory block MB by the dielectric sidewall layer 50.

After forming the memory blocks MB, a dielectric layer ILD4 may be formed on the memory blocks MB and the dielectric structure 40. Thereafter, contact holes are formed to pass through the dielectric layer ILD4, the dielectric structure 40 and the dielectric layer ILD3 and expose the bottom wiring, lines 70, and contact plugs CNT2 may be formed by filling a conductive material in the contact holes.

The top wiring lines 80 are formed on the dielectric layer ILD4 to be electrically coupled with the bottom wiring lines 70 through the contact plugs CNT2. The top wiring lines 80 may be formed of a conductive material which made relatively smaller resistance conductive material than that of the bottom wiring lines 70. For example, the top wiring lines 80 may include copper (Cu).

As described above, in the present embodiment, since the dielectric structure 40 which provides the spaces for forming the contact plugs CNT2 is formed using the interlayer dielectric layers 30 and the sacrificial layers 32 used when forming the cell strings ST, a processing time and a processing cost may be saved.

Figure 13:
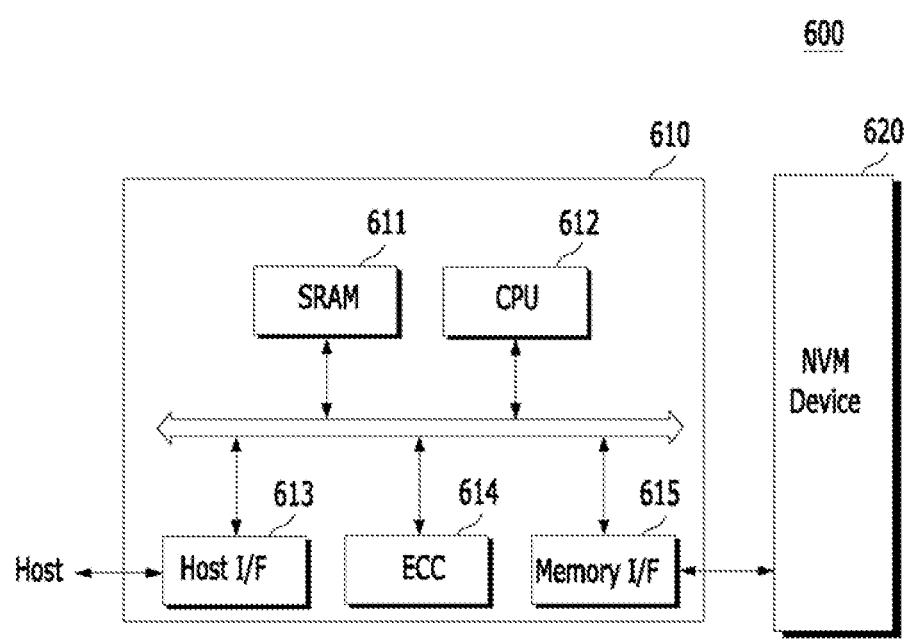
FIG. 13 is a simplified block diagram schematically illustrating a memory system including a semiconductor memory device, according to an embodiment of the invention.

FIG. 13 is a simplified block diagram schematically illustrating a memory system 600 including a nonvolatile memory device 620, according to an embodiment of the present invention.

The nonvolatile memory device 620 may include semiconductor memory, according to an embodiment of the invention as described above. The memory system 600 may also include a memory controller 610. The memory controller 610 may control the nonvolatile memory device 620. For example, the combination of the nonvolatile memory device 620 and the memory controller 610, may be configured as a memory card or a solid state disk (SSD). An SRAM 611 may be used as the working memory of a central processing unit (CPU) 612. A host interface 613 may include the data exchange protocol of a host which may be coupled with the memory system 600.

The memory controller 610 may include a host interface 613, an error correction code unit 614, a memory interface 615, a CPU 612 and a SRAM electrically coupled via an internal bus. All these components are well known in the art and, hence, will not be described in detail.

The error correction code (ECC) block 614 may detect and correct an error included in the data read out from the nonvolatile memory device 620.

The memory interface 615 may interface with the nonvolatile memory device 620. The CPU 612 may perform general control operations for data exchange of the memory controller 610.

Although not shown, it should become apparent to a person skilled in the art that the memory system 600 may further be provided with a ROM which stores code data for interfacing with the host. The nonvolatile memory device 620 may be provided as a multi-chip package constructed by a plurality of flash memory chips.

The memory system 600 may be used as a storage medium of high reliability having a low probability of an error occurring. The aforementioned semiconductor memory device may be provided for a memory system such as a solid state disk (SSD). The memory controller 610 may communicate with an external device (for example, the host) through one of various interface protocols such as a USB (universal serial bus) protocol an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 14:
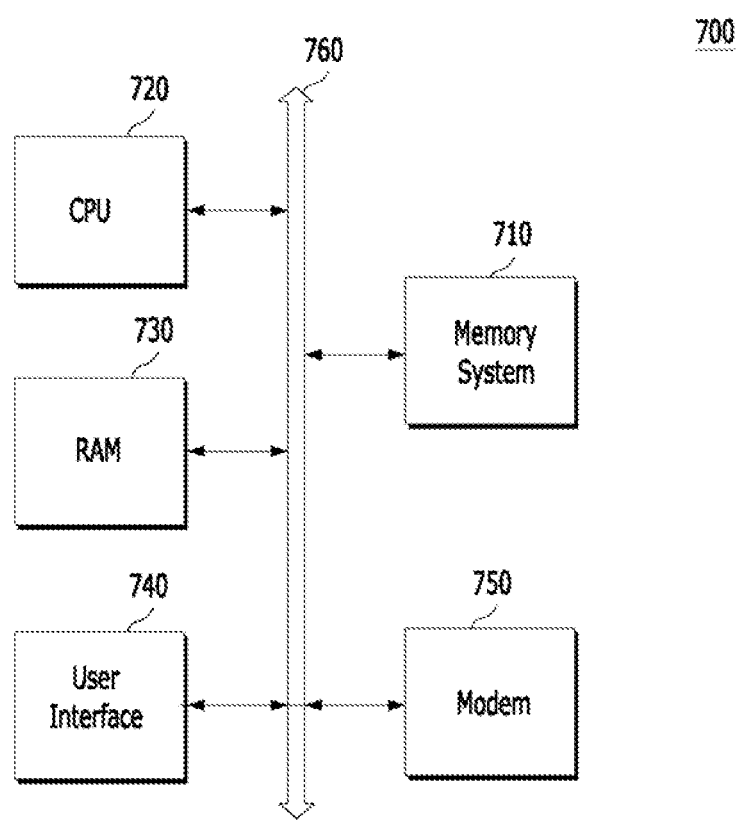
FIG. 14 is a simplified block diagram schematically illustrating a computing system including a semiconductor memory device, according to an embodiment of the invention.

FIG. 14 is a simplified block diagram schematically illustrating a computing system including a semiconductor memory device, according to an embodiment of the present invention.

Referring to FIG. 14, a computing system 700 according to an embodiment may include a microprocessor (or CPU) 720, a RAM 730, a user interface 740, a modem 750 such as a baseband chipset, and a memory system 710, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory (for example, a NAND or a NOR flash memory).

While various embodiments have been described above, it will be understood to those skilled in the art that the embodiments described are provided by way of example only. Accordingly, the semiconductor memory device of a 3-dimensional structure and the method for manufacturing the same described herein should not be limited based on the described embodiments. Many other embodiments and variations thereof may be envisaged by those skilled in the art to which the invention pertains without departing from the scope and spirit of the invention as defined by the appended claims.

What is claimed is:

1. A method for manufacturing a semiconductor memory device, comprising:
   forming a peripheral circuit over a substrate comprising, cell regions and a contact region between the cell regions;
   forming bottom wiring lines over the peripheral circuit the bottom wiring lines being electrically coupled with the peripheral circuit;

stacking alternating layers of interlayer dielectric layers and sacrificial layers over the bottom wiring lines;

forming a first slit for dividing the interlayer dielectric layers and the sacrificial layers of the contact region into a first portion and a second portion, wherein the first portion is continuous with the interlayer dielectric layers and the sacrificial layers of the cell region, and the second portion is isolated from the first portion and the interlayer dielectric layers and the sacrificial layers of the cell region by the first slit, thereby form a dielectric structure constructed with the second portion;

forming a dielectric sidewall layer which fills the first slit and surrounds the dielectric structure;

forming a second slit through the interlayer dielectric layers and the sacrificial layers;

removing the sacrificial layers which are exposed by the second slit without removing the sacrificial layers included in the dielectric structure using the dielectric sidewall layer as an etching mask;

forming a conductive material in spaces from which the sacrificial layers are removed to thereby form conductive lines;

forming contact plugs electrically coupled with the bottom wiring lines, through the dielectric structure; and forming top wiring lines electrically coupled with the contact plugs.

2. The method according to claim 1, further comprising:

forming a through hole passing through the first portion of the interlayer dielectric layers and the sacrificial layers of the contact region, before the forming of the second slit; and forming a support which fills the through hole.

3. The method according to claim 2, wherein the forming of the through hole is performed simultaneously with the forming of the first slit.

4. The method according to claim 2, wherein the forming of the support is performed simultaneously with the forming of the dielectric sidewall layer.

5. The method according to claim 1, wherein the support and the dielectric sidewall layer are formed of a material which has an etching selectivity different from the sacrificial layers.

6. The method according to claim 5, Wherein the support and the dielectric sidewall layer are formed of an oxide-based material, and the sacrificial layers are formed of a nitride-based material.

7. The method according to claim 1, wherein the forming of the second slit is performed such that the interlayer dielectric layers and the sacrificial layers are divided into memory block units by the second slit.

* * * * *